United States Patent
Chen et al.

(10) Patent No.: US 8,897,093 B2
(45) Date of Patent: Nov. 25, 2014

(54) CONTROLLING METHOD OF CONNECTOR, CONNECTOR, AND MEMORY STORAGE DEVICE

(71) Applicant: Phison Electronics Corp., Miaoli (TW)

(72) Inventors: Chih-Ming Chen, Hsinchu County (TW); Ming-Hui Tseng, Hsinchu (TW)

(73) Assignee: Phison Electronics Corp., Miaoli (TW)

( * ) Notice: Subject to any disclaimer, the term of this patent is extended or adjusted under 35 U.S.C. 154(b) by 133 days.

(21) Appl. No.: 13/787,773

(22) Filed: Mar. 6, 2013

(65) Prior Publication Data
US 2014/0192608 A1    Jul. 10, 2014

(30) Foreign Application Priority Data
Jan. 7, 2013 (TW) .............................. 102100464 A

(51) Int. Cl.
| | | |
|---|---|---|
| G11C 7/10 | (2006.01) | |
| G11C 8/18 | (2006.01) | |
| G11C 7/08 | (2006.01) | |
| G11C 11/4076 | (2006.01) | |
| G11C 5/14 | (2006.01) | |
| G11C 29/02 | (2006.01) | |
| G11C 7/22 | (2006.01) | |

(52) U.S. Cl.
CPC .............. *G11C 5/148* (2013.01); *G11C 29/023* (2013.01); *G11C 7/222* (2013.01); *G11C 11/4076* (2013.01); *G11C 7/10* (2013.01); *G11C 7/22* (2013.01); *G11C 29/028* (2013.01)

USPC ... 365/227; 365/191; 365/233.1; 365/233.11; 365/233.5; 365/236

(58) Field of Classification Search
CPC ............ G11C 7/22; G11C 7/222; G11C 7/10; G11C 29/028; G11C 29/023; G11C 11/0476
USPC .............. 365/191, 227, 233.1, 233.11, 233.5, 365/236
See application file for complete search history.

(56) References Cited

U.S. PATENT DOCUMENTS

| | | | |
|---|---|---|---|
| 2004/0052319 A1* | 3/2004 | Wakamatsu | 375/343 |
| 2007/0081267 A1* | 4/2007 | Yoshida et al. | 360/51 |
| 2007/0140388 A1* | 6/2007 | Mondet et al. | 375/344 |

* cited by examiner

*Primary Examiner* — Ly D Pham
(74) *Attorney, Agent, or Firm* — Jianq Chyun IP Office

(57) ABSTRACT

A controlling method of a connector, the connector, and a memory storage device are provided. The controlling method includes following steps. A first clock signal generated by a first oscillator in the connector is obtained. A second clock signal generated by a second oscillator in the connector is obtained. A frequency shift of the first oscillator is smaller than a frequency shift of the second oscillator. A detection window information corresponding to the second clock signal is corrected according to the first clock signal and the second clock signal. The first oscillator is turned off. A signal stream including a first signal is received. A detection window is generated according to the corrected detection window information and the second clock signal, and whether the first signal is a burst signal is determined according to the detection window. Thereby, the power consumption of the connector is reduced.

24 Claims, 7 Drawing Sheets

CONTROLLING METHOD OF CONNECTOR, CONNECTOR, AND MEMORY STORAGE DEVICE

CROSS-REFERENCE TO RELATED APPLICATION

This application claims the priority benefit of Taiwan application serial no. 102100464, filed on Jan. 7, 2013. The entirety of the above-mentioned patent application is hereby incorporated by reference herein and made a part of this specification.

BACKGROUND

1. Technology Field

The invention generally relates to a controlling method for a connector, and more particularly, to a connector having at least two oscillators, a controlling method for the connector, and a memory storage device using the connector.

2. Description of Related Art

Along with the widespread of digital cameras, cell phones, and MP3 in recently years, the consumers' demand to storage media has increased drastically. Rewritable non-volatile memory module (for example, flash memory) is one of the most adaptable memories for aforementioned portable multimedia devices due to its characteristics such as data non-volatility, low power consumption, small volume, and non-mechanical structure.

Generally, a rewritable non-volatile memory module is controlled by a memory controller, and the memory controller is coupled to a host system through a connector. The operation states of a connector usually include at least an active state and an inactive state based on the specification the connector conforms to. In the active state, the host system can access the rewritable non-volatile memory module. In the inactive state, the memory controller can turn off some of its components or functions to reduce the power consumption. Besides, in the inactive state, the connector continuously receives a signal from the host system and determines whether the signal is a wake-up signal. If the connector receives a wake-up signal from the host system, the connector returns to the active state. The connector includes an oscillator, and the oscillator provides a clock signal such that the connector can detect the wake-up signal. The oscillator consumes most of the power in the inactive state. Thereby, how to reduce the power consumed by a connector in the inactive state is a subject to be resolved in the industry.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the invention is directed to a controlling method for a connector, the connector, and a memory storage device, in which the power consumption of the connector is reduced.

An exemplary embodiment of the invention provides a controlling method of a connector. The controlling method includes following steps. A first clock signal generated by a first oscillator in the connector is obtained. A second clock signal generated by a second oscillator in the connector is obtained. A frequency shift of the first oscillator is smaller than a frequency shift of the second oscillator. A detection window information corresponding to the second clock signal is corrected according to the first clock signal and the second clock signal. The first oscillator is turned off. A signal stream is received, where the signal stream includes a first signal. A detection window is generated according to the corrected detection window information and the second clock signal, and whether the first signal is a burst signal is determined according to the detection window.

An exemplary embodiment of the invention provides a connector including a first oscillator, a second oscillator, a power management circuit, and a checking circuit. The first oscillator provides a first clock signal. The second oscillator provides a second clock signal. A frequency shift of the first oscillator is smaller than a frequency shift of the second oscillator. The power management circuit is coupled to the first oscillator and the second oscillator. The power management circuit receives the first clock signal and the second clock signal, corrects a detection window information corresponding to the second clock signal according to the first clock signal and the second clock signal, and turns off the first oscillator. The checking circuit is coupled to the power management circuit and the second oscillator. The checking circuit receives a signal stream, where the signal stream includes a first signal. The checking circuit generates a detection window according to the corrected detection window information and the second clock signal and determines whether the first signal is a burst signal according to the detection window.

An exemplary embodiment of the invention provides a memory storage device including a connector, a rewritable non-volatile memory module, and a memory controller. The connector is configured to couple to a host system and receives a signal stream from the host system, where the signal stream includes a first signal. The rewritable non-volatile memory module includes a plurality of physical erasing units. The memory controller is coupled to the connector and the rewritable non-volatile memory module. The connector includes a first oscillator, a second oscillator, a power management circuit, and a checking circuit. The first oscillator provides a first clock signal. The second oscillator provides a second clock signal. A frequency shift of the first oscillator is smaller than a frequency shift of the second oscillator. The power management circuit is coupled to the first oscillator and the second oscillator. The power management circuit receives the first clock signal and the second clock signal, corrects a detection window information corresponding to the second clock signal according to the first clock signal and the second clock signal, and turns off the first oscillator. The checking circuit is coupled to the power management circuit and the second oscillator. The checking circuit receives a signal stream, where the signal stream includes a first signal. The checking circuit also generates a detection window according to the corrected detection window information and the second clock signal and determines whether the first signal is a burst signal according to the detection window.

As described above, embodiments of the invention provide a controlling method, a connector, and a memory storage device, in which an oscillator is calibrated through another oscillator to turn off the oscillator consuming more power, so that the power consumption of the connector is reduced.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
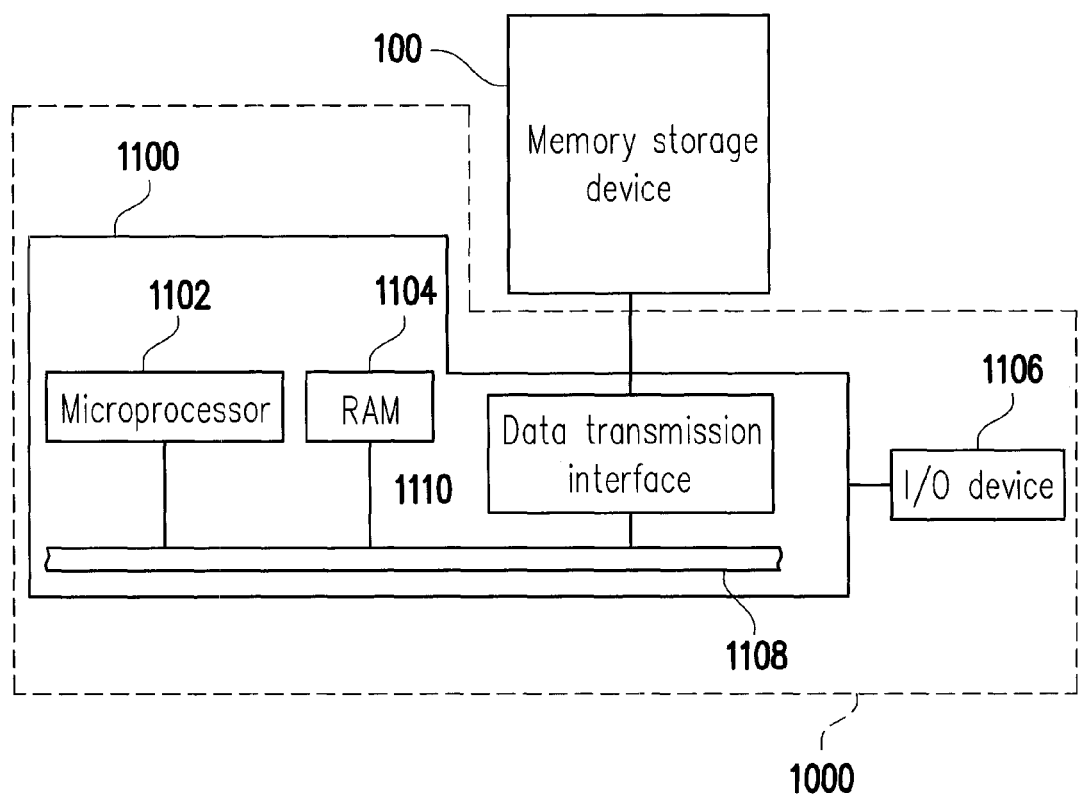
FIG. 1A illustrates a host system and a memory storage device according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also referred to as a memory storage system) includes a rewritable non-volatile memory module and a controller (also referred to as a control circuit). The memory storage device is usually used along with a host system so that the host system can write data into or read data from the memory storage device.

FIG. 1A illustrates a host system and a memory storage device according to an exemplary embodiment.

Figure 1B:
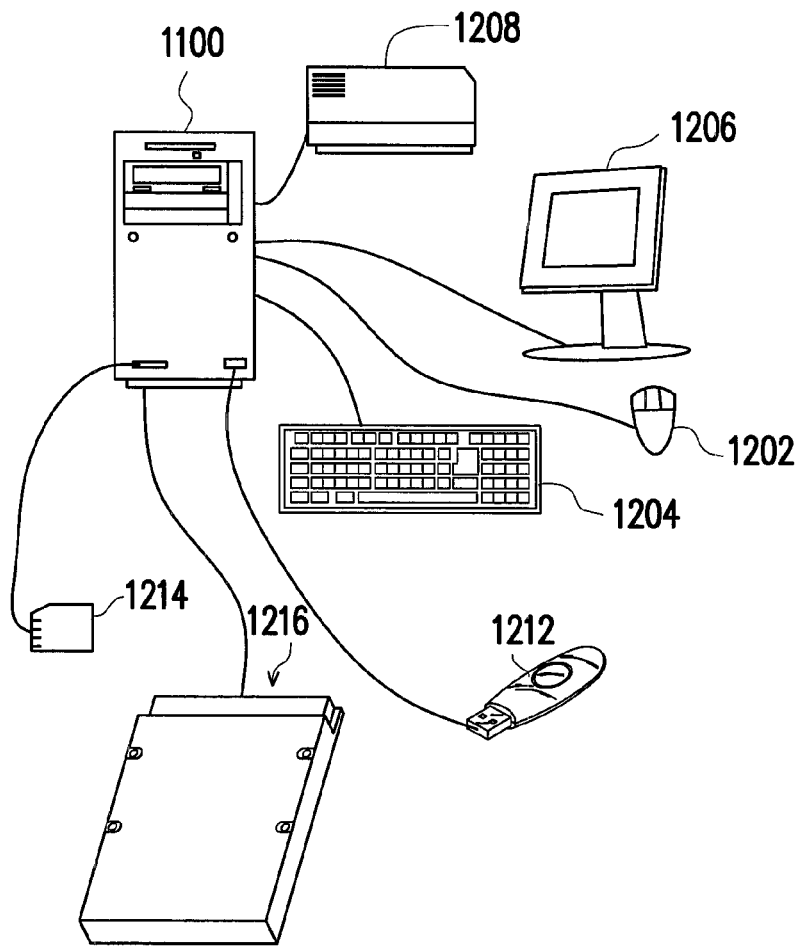
FIG. 1B is a diagram of a computer, an input/output (I/O) device, and a memory storage device according to an exemplary embodiment.

Referring to FIG. 1A, the host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 1B. However, the I/O device 1106 is not limited to the devices illustrated in FIG. 1B and may further include other devices.

In the present embodiment, a memory storage device 100 is coupled to other components of the host system 1000 through a data transmission interface 1110. Data can be written into or read from the memory storage device 100 through operations of the microprocessor 1102, the RAM 1104, and the I/O device 1106. The memory storage device 100 is a rewritable non-volatile memory storage device, such as the flash drive 1212, the memory card 1214, or the solid state drive (SSD) 1216 illustrated in FIG. 1B.

Figure 1C:
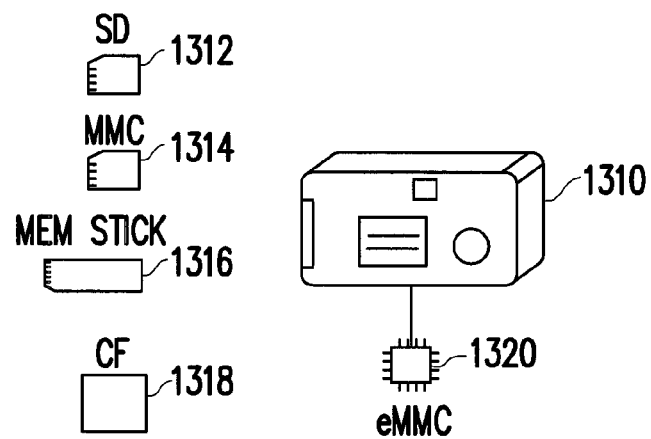
FIG. 1C is a diagram of a host system and a memory storage device according to an exemplary embodiment.

Generally speaking, the host system 1000 can be substantially any system that works with the memory storage device 100 to store data. Even though the host system 1000 is described as a computer system in the present exemplary embodiment, in another exemplary embodiment of the invention, the host system 1000 may also be a digital camera, a video camera, a communication device, an audio player, or a video player. For example, if the host system is a digital camera (video camera) 1310, the rewritable non-volatile memory storage device is then a secure digital (SD) card 1312, a multi media card (MMC) card 1314, a memory stick (MS) 1316, a compact flash (CF) card 1318, or an embedded storage device 1320 (as shown in FIG. 1C) used by the digital camera (video camera) 1310. The embedded storage device 1320 includes an embedded MMC (eMMC). It should be mentioned that an eMMC is directly coupled to the motherboard of a host system.

Figure 2:
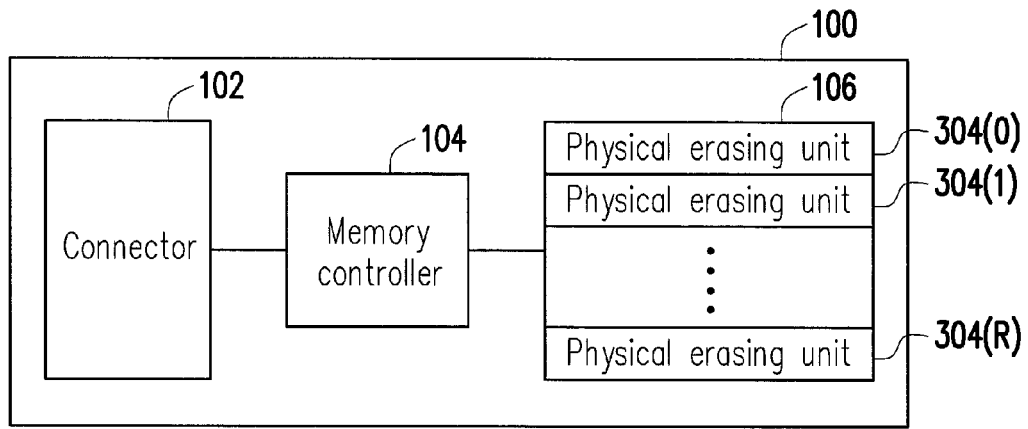
FIG. 2 is a schematic block diagram of the memory storage device in FIG. 1A.

FIG. 2 is a schematic block diagram of the memory storage device in FIG. 1A.

Referring to FIG. 2, the memory storage device 100 includes a connector 102, a memory controller 104, and a rewritable non-volatile memory module 106.

In the present exemplary embodiment, the connector 102 complies with the serial advanced technology attachment (SATA) standard. However, the invention is not limited thereto, and the connector 102 may also comply with the parallel advanced technology attachment (PATA) standard, the Institute of Electrical and Electronic Engineers (IEEE) 1394 standard, the peripheral component interconnect (PCI) express standard, the universal serial bus (USB) standard, the SD interface standard, the ultra high speed-I (UHS-I) interface standard, the ultra high speed-II (UHS-II) interface standard, the MS interface standard, the MMC interface standard, the eMMC interface standard, the universal flash storage (UFS) interface standard, the CF interface standard, the integrated device electronics (IDE) standard, or any other suitable standard.

The memory controller 104 executes a plurality of logic gates or control instructions implemented in a hardware form or a firmware form and performs data writing, reading, and erasing operations on the rewritable non-volatile memory module 106 according to commands issued by the host system 1000.

The rewritable non-volatile memory module 106 is coupled to the memory controller 104 and configured to store data written by the host system 1000. The is rewritable non-volatile memory module 106 has physical erasing units 304(0)-304(R). The physical erasing units 304(0)-304(R) may belong to a same memory die or different memory dies. Each physical erasing unit has a plurality of physical programming units. The physical programming units belonging to the same physical erasing unit can be individually written but have to be erased all together. Each physical erasing unit may be composed of 128 physical programming units. However, the invention is not limited thereto, and each physical erasing unit may also be composed of 64, 256, or any other number of physical programming units.

To be specific, physical erasing unit is the smallest unit for erasing data. Namely, each physical erasing unit contains the least number of memory cells that are erased all together. Physical programming unit is the smallest unit for programming data. Namely, physical programming unit is the smallest unit for writing data. Each physical programming unit usually includes a data bit area and a redundant bit area. The data bit area includes a plurality of physical access addresses for storing user data, and the redundant bit area is used for storing system data (for example, control information and error checking and correcting codes (ECCs)). In the present exemplary embodiment, the data bit area of each physical programming unit includes 4 physical access addresses, and the size of each physical access address is 512 bytes (B). However, the size and number of the physical access addresses are not limited in the invention, and in other exemplary embodiments, a data bit area may also include 8, 16, or any other greater or smaller number of physical access addresses. The physical erasing units may be physical blocks, and the physical programming units may be physical pages or physical sectors.

In the present exemplary embodiment, the rewritable non-volatile memory module 106 is a multi level cell (MLC) NAND flash memory module (i.e., each memory cell stores a data of at least 2 bits). However, the invention is not limited thereto, and the rewritable non-volatile memory module 106 may also be a single level cell (SLC) NAND flash memory module, a trinary level cell (TLC) NAND flash memory module, any other flash memory module, or any memory module with the same characteristics.

Figure 3:
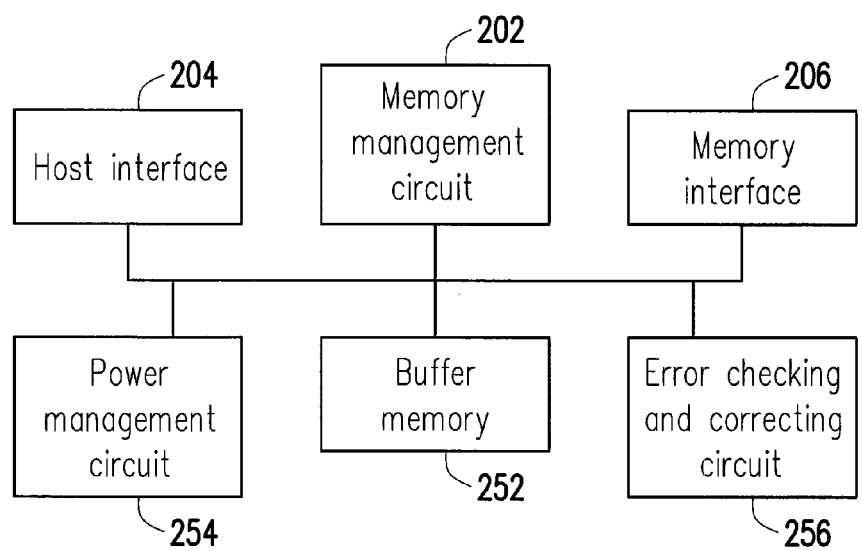
FIG. 3 is a schematic block diagram of a memory controller according to an exemplary embodiment.

FIG. 3 is a schematic block diagram of a memory controller according to an exemplary embodiment.

Referring to FIG. 3, the memory controller 104 includes a memory management circuit 202, a host interface 204, and a memory interface 206.

The memory management circuit 202 controls the overall operation of the memory controller 104. To be specific, the memory management circuit 202 has a plurality of control instructions, and when the memory storage device 100 is in operation, the control instructions are executed to perform data writing, data reading, and data erasing operations.

In the present exemplary embodiment, the control instructions of the memory management circuit 202 are implemented in a firmware form. For example, the memory management circuit 202 has a microprocessor unit (not shown) and a read-only memory (ROM, not shown), and the control instructions are burnt into the ROM. When the memory storage device 100 is in operation, the control instructions are executed by the microprocessor unit to carry out various data writing, data reading, and data erasing operations.

In another exemplary embodiment of the invention, the control instructions of the memory management circuit 202 may also be stored in a specific area of the rewritable non-volatile memory module 106 (for example, a system area exclusively used for storing system data in a memory module) as program codes. In addition, the memory management circuit 202 has a microprocessor unit (not shown), a ROM (not shown), and a RAM (not shown). In particular, the ROM has a driving code segment. When the memory controller 104 is enabled, the microprocessor unit first executes the driving code segment to load the control instructions from the rewritable non-volatile memory module 106 into the RAM of the memory management circuit 202. Thereafter, the microprocessor unit runs the control instructions to perform various data writing, reading, and erasing operations.

In yet another exemplary embodiment of the invention, the control instructions of the memory management circuit 202 may also be implemented in a hardware form. For example, the memory management circuit 202 includes a microcontroller, a memory management unit, a memory writing unit, a memory reading unit, a memory erasing unit, and a data processing unit. The memory management unit, the memory writing unit, the memory reading unit, the memory erasing unit, and the data processing unit are coupled to the microcontroller. The memory management unit is configured to manage the physical erasing units of the rewritable non-volatile memory module 106. The memory writing unit is configured to issue a write command to the rewritable non-volatile memory module 106 to write data into the rewritable non-volatile memory module 106. The memory reading unit is configured to issue a read command to the rewritable non-volatile memory module 106 to read data from the rewritable non-volatile memory module 106. The memory erasing unit is configured to issue an erase command to the rewritable non-volatile memory module 106 to erase data from the rewritable non-volatile memory module 106. The data processing unit is configured to process data to be written into and read from the rewritable non-volatile memory module 106.

The host interface 204 is coupled to the memory management circuit 202 and configured to receive and identify commands and data from the host system 1000. Namely, commands and data transmitted by the host system 1000 are transmitted to the memory management circuit 202 through the host interface 204. In the present exemplary embodiment, the host interface 204 complies with the SATA standard. However, the invention is not limited thereto, and the host interface 204 may also comply with the PCI express standard, the USB standard, the SD standard, the UHS-I standard, the UHS-II standard, the MS standard, the MMC standard, the eMMC standard, the UFS standard, the CF standard, the IDE standard, or any other suitable data transmission standard.

The memory interface 206 is coupled to the memory management circuit 202 and configured to access the rewritable non-volatile memory module 106. Namely, data to be written into the rewritable non-volatile memory module 106 is converted by the memory interface 206 into a format acceptable to the rewritable non-volatile memory module 106.

In an exemplary embodiment of the present invention, the memory controller 104 further includes a buffer memory 252, a power management circuit 254, and an ECC circuit 256.

The buffer memory 252 is coupled to the memory management circuit 202 and configured to temporarily store data and commands from the host system 1000 or data from the rewritable non-volatile memory module 106.

The power management circuit 254 is coupled to the memory management circuit 202 and configured to control the power supply of the memory storage device 100.

The ECC circuit 256 is coupled to the memory management circuit 202 and configured to perform an ECC procedure to ensure data accuracy. To be specific, when the memory management circuit 202 receives a write command from the host system 1000, the ECC circuit 256 generates a corresponding ECC code for the data corresponding to the write command, and the memory management circuit 202 writes the data corresponding to the write command and the corresponding ECC code into the rewritable non-volatile memory module 106. Subsequently, when the memory management circuit 202 reads the data from the rewritable non-volatile memory module 106, it also reads the ECC code corresponding to the data, and the ECC circuit 256 performs the ECC procedure on the data according to the ECC code.

Figure 4:
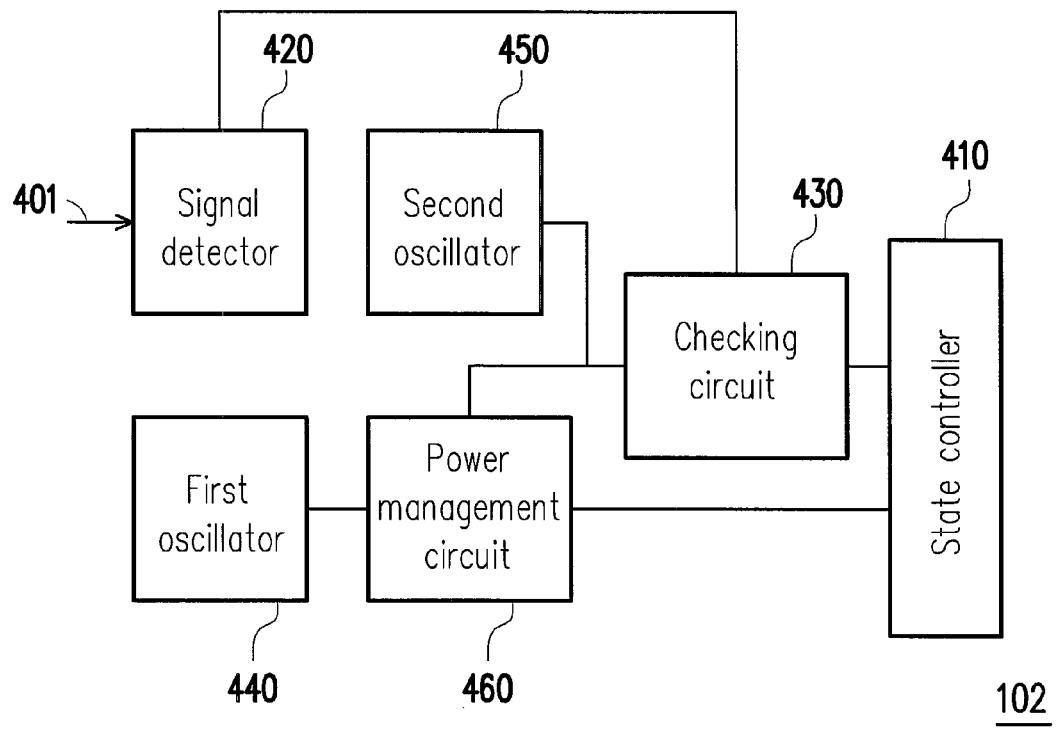
FIG. 4 is a block diagram of a connector according to an exemplary embodiment.

FIG. 4 is a block diagram of a connector according to an exemplary embodiment.

Referring to FIG. 4, the connector 102 includes a state controller 410, a signal detector 420, a checking circuit 430, a first oscillator 440, a second oscillator 450, and a power management circuit 460.

The state controller 410 is configured to control the operation state of the connector 102. When the host system 1000 accesses the memory storage device 100, the operation state of the connector 102 is an active state. Contrarily, if the host system 1000 does not access the memory storage device 100, the state controller 410 may control the connector 102 to enter an inactive state. In the inactive state, the memory controller 104 turns off part of its circuit to reduce the power consumption. On the other hand, when the connector 102 is in the inactive state, if the host system 1000 transmits a predetermined signal to the connector 102, the state controller 410 changes the operation state of the connector 102 into the active state. For example, if the connector 102 complies with the SATA standard, the operation state of the connector 102 includes an active state and an inactive state, where the inactive state further includes one or both of a partial state and a slumber state. Besides, the predetermined signal is a wake-up signal or a reset signal. If the host system 1000 transmits a wake-up signal or a reset signal to the connector 102, the connector 102 returns to the active state from the partial state or the slumber state. Generally, the power saving effect of the slumber state is better than that of the partial state, but returning from the slumber state to the active state takes a longer time than returning from the partial state to the active state.

The signal detector 420 receives a signal stream 401 from the host system 1000. The signal stream 401 includes one or more signals. The signal detector 420 detects the power level of the signal stream 401. When the operation state of the connector 102 is the inactive state, if the signal detector 420 detects that the power level of one signal in the signal stream 401 is higher than a predetermined power, the signal detector 420 transmits the signal stream 401 to the checking circuit 430. Contrarily, if none of the signals in the signal stream 401 has a power level higher than the predetermined power, the signal detector 420 does not transmit the signal stream 401 to the checking circuit 430. In the present exemplary embodiment, the signal detector 420 is a carrier squelch circuit, a noise squelch circuit, or any other type of signal detection circuit.

The checking circuit 430 is configured to determine whether the signal stream 401 includes at least part of the predetermined signal. In the present exemplary embodiment, the signal stream 401 conforms to an out-of-band signaling (OOB-signaling) specification, and the predetermined signal is a wake-up signal or a reset signal. OOB-signaling is a data pattern, in which a gap signal and a burst signal are defined. The amplitude of the burst signal fluctuates with a frequency (for example, 1.5 GHz), and the amplitude of the gap signal remains unchanged. The burst signal and the gap signal constitute a wake-up signal and a reset signal. The checking circuit 430 detects the gap signal and the burst signal in the signal stream 401 and determines whether the signal stream 401 includes at least part of the wake-up signal or the reset signal. If the checking circuit 430 determines that the signal stream 401 includes part of the wake-up signal or the reset signal, the checking circuit 430 drives the state controller 410 to change the operation state of the connector 102 to the active state. The wake-up signal and the reset signal will be explained in detail later on.

The first oscillator 440 provides a first clock signal, and the second oscillator 450 provides a second clock signal. In the present exemplary embodiment, the second oscillator 450 is a RC oscillator. However, the invention is not limited thereto, and the second oscillator 450 may also be a LC resonator, a ring oscillator, a relaxation oscillator, or a multivibrator oscillator. In particular, the frequency shift of the first oscillator 440 is smaller than the frequency shift of the second oscillator 450 (or the frequency stability of the first oscillator 440 is higher than the frequency stability of the second oscillator 450), or the power consumption of the first oscillator 440 is greater than the power consumption of the second oscillator 450. For example, the first oscillator 440 provides the first clock signal of a specific frequency, and the frequency of the first clock signal does not shift more than 5% of the specific frequency. The second oscillator 450 provides the second clock signal of another specific frequency, but the frequency of the second clock signal may shift more than 20% of the other specific frequency. However, the invention is not limited thereto, and in another exemplary embodiment, the first oscillator 440 and the second oscillator 450 may have other different frequency shifts.

The first clock signal or the second clock signal is transmitted to the checking circuit 430. The checking circuit 430 detects a burst signal in the signal stream 401 according to the first clock signal or the second clock signal.

Figure 5A:
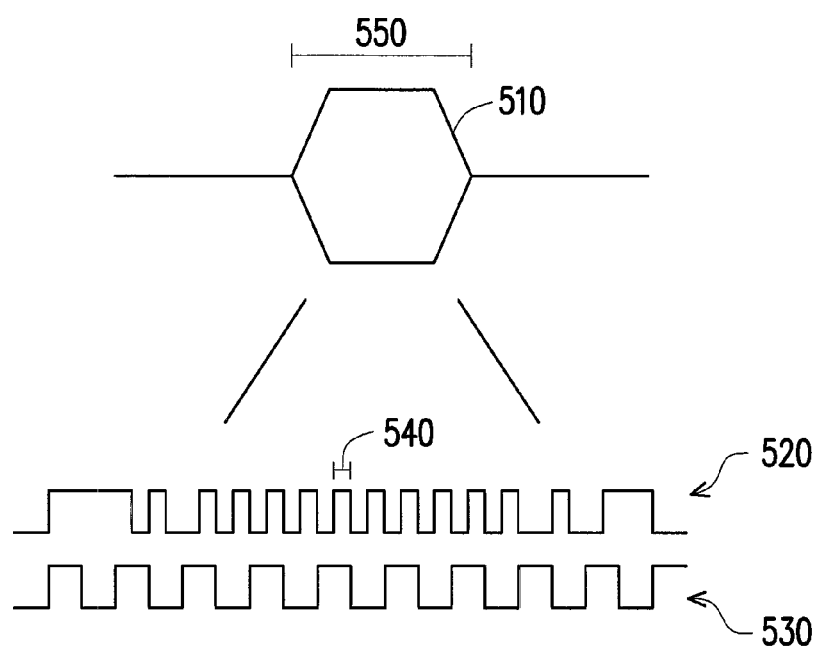
FIG. 5A is a diagram of a burst signal according to an exemplary embodiment.

FIG. 5A is a diagram of a burst signal according to an exemplary embodiment.

Referring to FIG. 5A, herein it is assumed that the signal stream 401 includes a burst signal 510. In the OOB-signaling specification, the burst signal 510 is composed of four align signals 520 or four predetermined character set signals. The predetermined character set signals may be D24.3 characteristic signals 530. The length of each sub signal in the align signals 520 or D24.3 characteristic signals 530 is an integral multiple of a unit interval (for example, a unit interval 540). Thus, as shown in FIG. 5, the length of the burst signal 510 is 160 unit intervals. In the SATA specification, the transmission rate between the connector 102 and the host system 1000 is 1.5 GHz, 3 GHz, or 6 GHz. Herein it is assumed that the transmission rate between the connector 102 and the host system 1000 is 1.5 GHz (not limited thereto). Accordingly, a unit interval is 1/1.5 G seconds. In other words, the length of the burst signal 510 is about 160*1/1.5 G=106.7 nano seconds (nS). The checking circuit 430 considers the first clock signal or the second clock signal as a reference clock and generates a detection window 550 according to a detection window information. For example, the detection window information contains the clock number of a detection window, and the time interval for the checking circuit 430 to count the clock number according to the first clock signal or the second clock signal is the detection window 550. The detection window 550 is used for determining whether the burst signal 510 is a burst signal conforming to the OOB-signaling specification. For example, if the checking circuit 430 determines that the length of the burst signal 510 is smaller than a first threshold or greater than a second threshold, the checking circuit 430 determines that the burst signal 510 is not a burst signal conforming to the OOB-signaling specification.

Figure 5B:
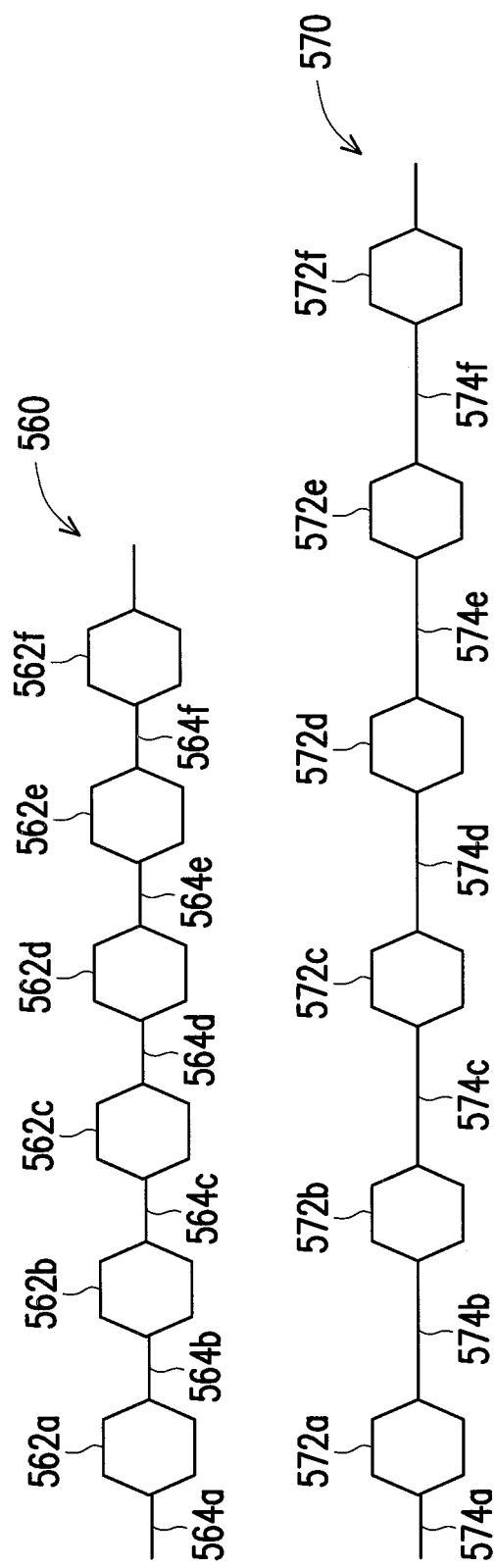
FIG. 5B is a diagram of a wake-up signal and a reset signal according to an exemplary embodiment.

FIG. 5B is a diagram of a wake-up signal and a reset signal according to an exemplary embodiment.

Referring to FIG. 5B, in the OOB-signaling specification, a wake-up signal 560 (also referred to as a COMWAKE signal) at least includes 6 burst signals 562a-562f and 6 gap signals 564a-564f, and a reset signal 570 (also referred to as a RESET signal) also includes 6 burst signals 572a-572f and 6 gap signals 574a-574f. The lengths of the burst signals 562a-562f are equal to the lengths of the burst signals 572a-572f, but the lengths of the gap signals 574a-574f are greater than the lengths of the gap signals 564a-564f. The checking circuit 430 generates detection windows of different lengths to detect the burst signal and gap signal in the signal stream 401. It should be noted that if the checking circuit 430 determines that the signal stream 401 includes part of the predetermined signal (for example, more than 4 burst signals, more than 4 gap signals, or both), the checking circuit 430 drives the state controller 410 to change the operation state of the connector 102 into the active state. For example, if the checking circuit 430 detects the burst signals 562a-562d and the gap signals 564a-564d or the burst signals 572a-572d and the gap signals 574a-574d, the operation state of the connector 102 is changed to the active state. However, in the present exemplary embodiment, the checking circuit 430 can detect the burst signal by simply determining whether a time duration of a signal cluster is equal to a predetermined value, in which if the time duration of the signal cluster is equal to the predetermined value, the checking circuit 430 determines that the signal is a burst signal. In this way, the checking circuit 430 needs not to analyze whether the signal cluster contains four align signals 520 or four predetermined character set signals.

Referring to FIG. 4 and FIG. 5A again, in the present exemplary embodiment, when the connector 102 is in the inactive state, the power management circuit 460 turns off the first oscillator 440, and the checking circuit 430 detects the burst signal according to the second clock signal and determines whether the signal stream 401 includes part of the wake-up signal or the reset signal. Because the frequency shift of the second clock signal is greater than that of the first clock signal, if the checking circuit 430 uses the second clock signal as the reference clock, the length of the detection window 550 may come with an error, such that the checking circuit 430 cannot determine whether the length of the burst signal 510 conforms to the OOB-signaling specification correctly. Thus, the power management circuit 460 corrects the detection window information corresponding to the second clock signal according to the first clock signal and the second clock signal and generates the detection window 550 according to the corrected detection window information and the second clock signal.

To be specific, the power management circuit 460 receives the first clock signal generated by the first oscillator 440 and the second clock signal generated by the second oscillator 450. The power management circuit 460 counts to a first count (for example, 4000, but not limited thereto) according to the first clock signal, and meanwhile, continuously updates a second count according to the second clock signal. Because the first clock signal is relatively more accurate, the power management circuit 460 assumes that a fixed interval lapses when it counts to the first count according to the first clock signal. The second count represents the number of times of counting within the fixed interval according to the second clock signal. For example, the second oscillator 450 provides a second clock signal having a frequency of 200 MHz, aforementioned fixed interval is 1 mS, and the second count is 220000 after the fixed interval lapses. Thus, the power management circuit 460 determines that the second clock signal comes with an error of 10%, and if the clock number of the detection window 550 before the correction is 200, the clock number after the correction is then 220. In other words, the power management circuit 460 generates a window clock number according to the first count and the second count. Besides, the power management circuit 460 sets a time interval for counting the window clock number according to the second clock signal as the detection window 550. However, the window clock number (i.e., the length of the detection window 550) is not limited in the invention.

In an exemplary embodiment, the power management circuit 460 corrects the detection window information once the system is turned on. However, the invention is not limited thereto, and the power management circuit 460 may also correct the detection window information when the connector 102 enters the inactive state. In another exemplary embodiment, the step of correcting the detection window information may also be executed by the memory controller 104. However, the invention is not limited thereto.

After the connector 102 enters the inactive state, the power management circuit 460 turns off the first oscillator 440. Because the first clock signal is further provided to other electronic components, in an exemplary embodiment, if the memory controller 104 determines that the first oscillator 440 can be turned off, the memory controller 104 transmits a signal to the power management circuit 460. After the memory controller 104 enters a power down mode, the power management circuit 460 turns off the first oscillator 440 according to the signal. In the power down mode, the memory controller 104 turns off most of its circuits or functions. However, the invention is not limited thereto, and the power management circuit 460 may also turn off the first oscillator 440 at other time points.

After the first oscillator 440 is turned off, the checking circuit 430 generates the detection window 550 according to the second clock signal and the corrected detection window information. The checking circuit 430 determines whether a signal in the signal stream 401 is a burst signal conforming to the OOB-signaling specification according to the detection window 550. The checking circuit 430 also determines whether the signal stream 401 includes part of a predetermined signal according to the detection window 550. If the checking circuit 430 determines that the signal stream 401 includes part of the predetermined signal, the checking circuit 430 transmits a signal to the state controller 410. after receiving the signal, the state controller 410 changes the operation state of the connector 102 from the inactive state to the active state, and the power management circuit 460 turns on the first oscillator 440. In the active state, the checking circuit 430 operates according to the first clock signal.

In the present exemplary embodiment, the connector 102 is disposed in the memory storage device 100. However, the invention is not limited thereto, and in other exemplary embodiments, the connector 102 may also be disposed in a hard disc, a network equipment, a CD-ROM, any type of embedded system, or any other electronic device.

Figure 6:
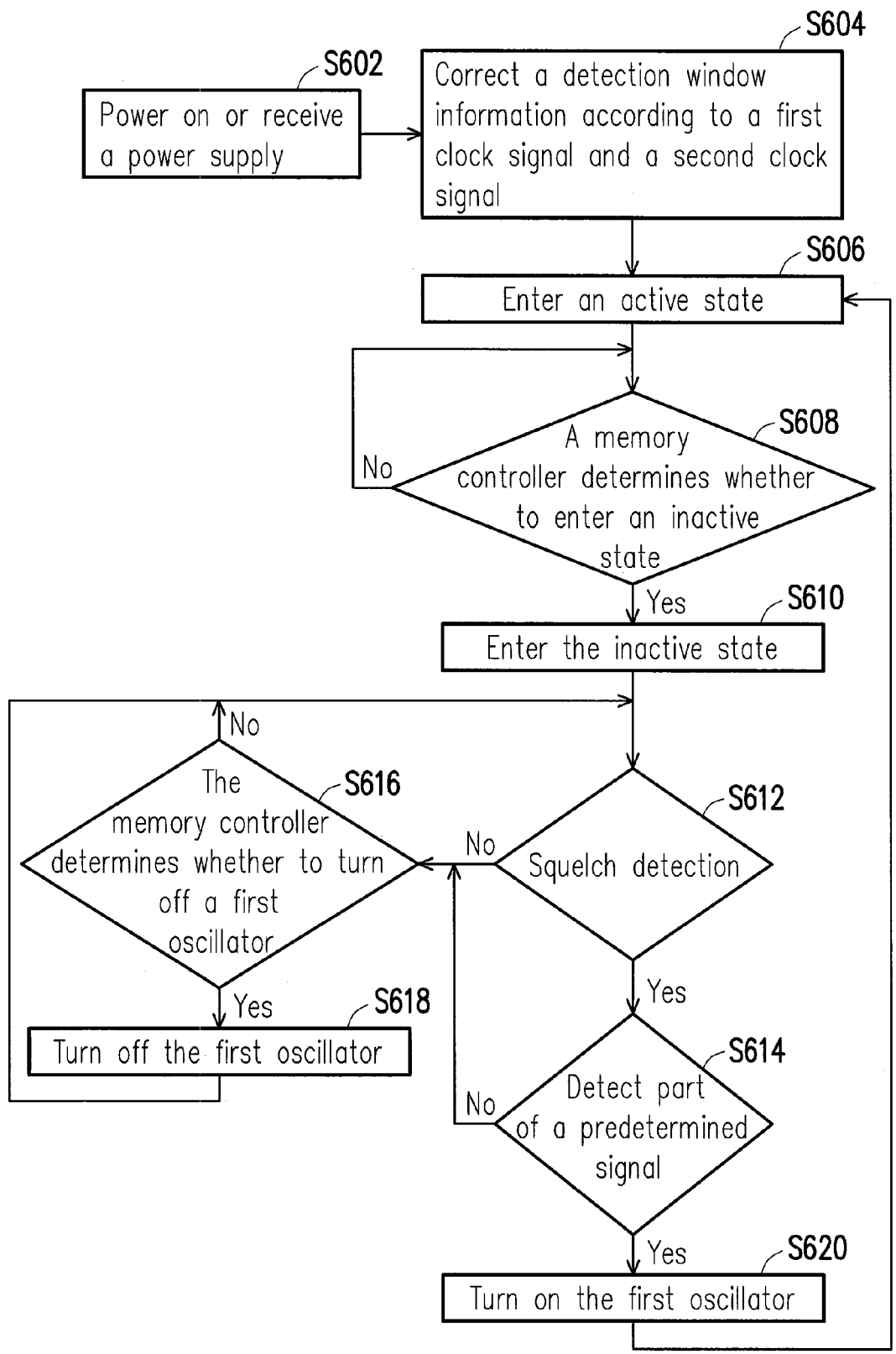
FIG. 6 is a system flowchart according to an exemplary embodiment.

FIG. 6 is a system flowchart according to an exemplary embodiment.

Referring to FIG. 6, in step S602, the memory storage device 100 is turned on or supplied with a power from the host system 1000.

In step S602, the power management circuit 460 (or the memory controller 104) corrects a detection window information corresponding to the second clock signal according to the first clock signal and the second clock signal.

In step S606, the connector 102 enters the active state.

In step S608, the memory controller 104 determines whether to enter the inactive state. The memory controller 104 can enter the inactive state according to an instruction issued by the host system 1000 or it is decided to enter the inactive state by the memory controller 104 itself. However, the invention is not limited thereto.

In step S610, the connector 102 enters the inactive state. Herein the power management circuit 460 turns off some circuits (for example, a phase-locked loop (PLL)) in the connector 102.

In step S612, the signal detector 420 executes a squelch detection, that is, constantly receives a signal stream from the host system 1000 and determines whether a power level (for example, amplitude) of the signal stream is higher than a predetermined power.

If the signal detector 420 determines that the power level of the signal stream is higher than the predetermined power in step S612, in step S614, the checking circuit 430 determines whether the signal stream contains part of a predetermined signal according to the second clock signal. If the checking circuit 430 determines that the signal stream contains part of the predetermined signal in step S614, in step S620, the power management circuit 460 turns on the first oscillator 440, and the connector 102 enters the active state (back to step S606).

If the signal detector 420 determines that the power level of the signal stream is not higher than the predetermined power in step S612 or the checking circuit 430 determines that the signal stream does not contain part of the predetermined signal in step S614, in step S616, the memory controller 104 determines whether the first oscillator 440 needs to be turned off. If the memory controller 104 determines that the first oscillator 440 needs not to be turned off in step S616, step S612 is executed again.

If the memory controller 104 determines that the first oscillator 440 needs to be turned off in step S616, in step S618, the power management circuit 460 turns off the first oscillator 440.

The steps in FIG. 6 have been described in detail above therefore will not be described herein.

Figure 7:
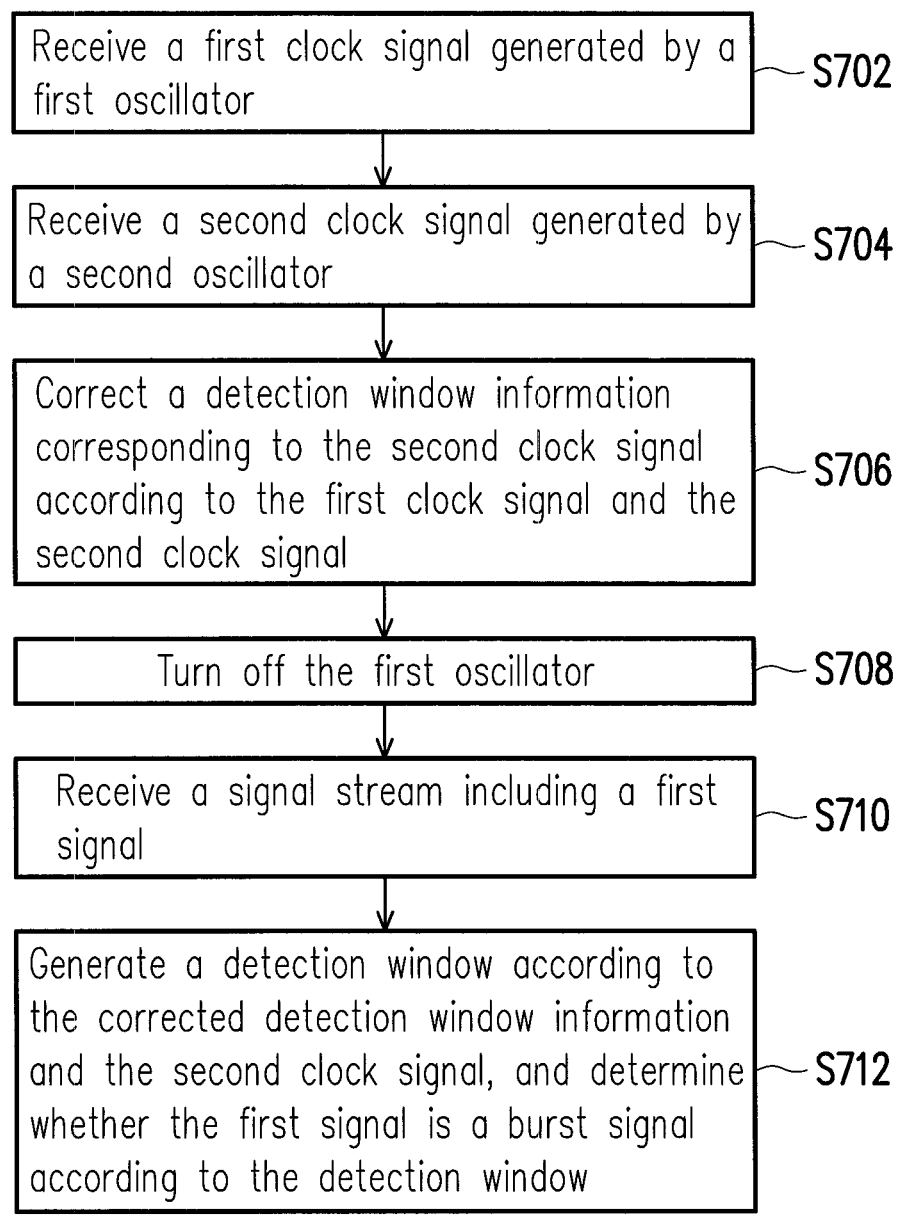
FIG. 7 is a flowchart of a controlling method of a connector according to an exemplary embodiment.

FIG. 7 is a flowchart of a controlling method of a connector according to an exemplary embodiment.

Referring to FIG. 7, in step S702, a first clock signal generated by a first oscillator is received. In step S704, a second clock signal generated by a second oscillator is received. In step S706, a detection window information corresponding to the second clock signal is corrected according to the first clock signal and the second clock signal. In step S708, the first oscillator is turned off. In step S710, a signal stream including a first signal is received. In step S712, a detection window is generated according to the corrected detection window information and the second clock signal, and whether the first signal is a burst signal is determined according to the detection window.

The steps in FIG. 7 can be implemented as a plurality of commands. These commands are stored in a memory and executed by a processor. Or, the steps in FIG. 7 can be implemented as one or more circuits (for example, the power management circuit 460 and the checking circuit 430). However, whether the steps in FIG. 7 are implemented in a software form or a hardware form is not limited in the invention. On the other hand, the steps in FIG. 7 have been described in detail above therefore will not be described herein.

As described above, embodiments of the invention provide a controlling method, a connector, and a memory storage device, in which a detection window information corresponding to a second oscillator can be corrected by using a first oscillator, so that the first oscillator can be turned off, and a detection window can be generated according to the corrected detection window information and used for detecting part of a predetermined signal. Thereby, the power consumption of the connector is reduced.

The previously described exemplary embodiments of the present invention have the advantages aforementioned, wherein the advantages aforementioned not required in all versions of the invention.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A controlling method for a connector, comprising:
obtaining a first clock signal generated by a first oscillator in the connector;
obtaining a second clock signal generated by a second oscillator in the connector, wherein a frequency shift of the first oscillator is smaller than a frequency shift of the second oscillator;
correcting a detection window information corresponding to the second clock signal according to the first clock signal and the second clock signal;
turning off the first oscillator;
receiving a signal stream, wherein the signal stream comprises a first signal; and
generating a detection window according to the corrected detection window information and the second clock signal, and determining whether the first signal is a burst signal according to the detection window.

2. The controlling method according to claim 1, wherein the step of correcting the detection window information corresponding to the second clock signal according to the first clock signal and the second clock signal comprises:
counting to a first count according to the first clock signal, and updating a second count according to the second clock signal; and
generating a window clock number according to the first count and the second count,
wherein the step of generating the detection window according to the corrected detection window information and the second clock signal comprises:
setting a time interval for counting the window clock number according to the second clock signal as the detection window.

3. The controlling method according to claim 1 further comprising:
determining whether the signal stream comprises at least part of a predetermined signal according to the detection window; and
if the signal stream comprises the at least part of the predetermined signal, turning on the first oscillator, and changing an operation state of the connector from an inactive state to an active state.

4. The controlling method according to claim 3, wherein the predetermined signal is a wake-up signal or a reset signal.

5. The controlling method according to claim 4, wherein the wake-up signal comprises the burst signal and a gap signal, the reset signal comprises the burst signal and a gap signal, and a length of the gap signal of the reset signal is greater than a length of the gap signal of the wake-up signal.

6. The controlling method according to claim 5, wherein the burst signal, the wake-up signal, and the reset signal conform to an out-of-band (OOB) signaling specification.

7. The controlling method according to claim 1, wherein the step of turning off the first oscillator comprises:
receiving a command from a memory controller; and turning off the first oscillator according to the command after the memory controller enters a power down mode.

8. The controlling method according to claim 1, wherein before the step of determining whether the first signal is the burst signal, the controlling method further comprises:
determining whether a power level of the signal stream is greater than a predetermined power;
if the power level of the signal stream is greater than the predetermined power, determining whether the first signal is the burst signal according to the detection window.

9. A connector, comprising:
a first oscillator, configured to provide a first clock signal;
a second oscillator, configured to provide a second clock signal, wherein a frequency shift of the first oscillator is smaller than a frequency shift of the second oscillator;
a power management circuit, coupled to the first oscillator and the second oscillator, configured to receive the first clock signal and the second clock signal, correct a detection window information corresponding to the second clock signal according to the first clock signal and the second clock signal, and turn off the first oscillator; and
a checking circuit, coupled to the power management circuit and the second oscillator, configured to receive a signal stream, wherein the signal stream comprises a first signal,
wherein the checking circuit is configured to generate a detection window according to the corrected detection window information and the second clock signal and determine whether the first signal is a burst signal according to the detection window.

10. The connector according to claim 9, wherein the operation of the power management circuit for correcting the detection window information corresponding to the second clock signal according to the first clock signal and the second clock signal comprises:
the power management circuit counts to a first count according to the first clock signal and updates a second count according to the second clock signal; and
the power management circuit generates a window clock number according to the first count and the second count,
the operation of the checking circuit for generating the detection window according to the corrected detection window information and the second clock signal comprises:
the checking circuit sets a time interval for counting the window clock number according to the second clock signal as the detection window.

11. The connector according to claim 9 further comprising:
a state controller, coupled to the checking circuit and the power management circuit,
wherein the checking circuit is further configured to determine whether the signal stream comprises at least part of a predetermined signal according to the detection window,
if the signal stream comprises the at least part of the predetermined signal, the power management circuit is configured to turn on the first oscillator, and the state controller is configured to change an operation state of the connector from an inactive state to an active state.

12. The connector according to claim 11, wherein the predetermined signal is a wake-up signal or a reset signal.

13. The connector according to claim 12, wherein the wake-up signal comprises the burst signal and a gap signal, the reset signal comprises the burst signal and a gap signal, and a length of the gap signal of the reset signal is greater than a length of the gap signal of the wake-up signal.

14. The connector according to claim 13, wherein the burst signal, the wake-up signal, and the reset signal conform to an out-of-band (OOB) signaling specification.

15. The connector according to claim 9, wherein the operation of the power management circuit for turning off the first oscillator comprises:
the power management circuit receives a command from a memory controller; and
the power management circuit turns off the first oscillator according to the command after the memory controller enters a power down mode.

16. The connector according to claim 9 further comprising:
a signal detector, coupled to the checking circuit, configured to receive the signal stream, and determine whether a power level of the signal stream is greater than a predetermined power,
if the power level of the signal stream is greater than the predetermined power, the signal detector is configured to transmit the signal stream to the checking circuit.

17. A memory storage device, comprising:
a connector, configured to couple to a host system and receive a signal stream from the host system, wherein the signal stream comprises a first signal;
a rewritable non-volatile memory module, comprising a plurality of physical erasing units; and
a memory controller, coupled to the connector and the rewritable non-volatile memory module,
wherein the connector comprises:
a first oscillator, configured to provide a first clock signal;
a second oscillator, configured to provide a second clock signal, wherein a frequency shift of the first oscillator is smaller than a frequency shift of the second oscillator;
a power management circuit, coupled to the first oscillator and the second oscillator, configured to receive the first clock signal and the second clock signal, correct a detection window information corresponding to the second clock signal according to the first clock signal and the second clock signal, and turn off the first oscillator; and
a checking circuit, coupled to the power management circuit and the second oscillator, configured to receive the signal stream, generate a detection window according to the corrected detection window information and the second clock signal, and determine whether the first signal is a burst signal according to the detection window.

18. The memory storage device according to claim 17, wherein the operation of the power management circuit for correcting the detection window information corresponding to the second clock signal according to the first clock signal and the second clock signal comprises:
the power management circuit counts to a first count according to the first clock signal and updates a second count according to the second clock signal; and
the power management circuit generates a window clock number according to the first count and the second count,
wherein the operation of the checking circuit for generating the detection window according to the corrected detection window information and the second clock signal comprises:
the checking circuit sets a time interval for counting the window clock number according to the second clock signal as the detection window.

19. The memory storage device according to claim 17, wherein the connector further comprises:
- a state controller, coupled to the checking circuit and the power management circuit,
- wherein the checking circuit is further configured to determine whether the signal stream comprises at least part of a predetermined signal according to the detection window,
- if the signal stream comprises the at least part of the predetermined signal, the power management circuit is configured to turn on the first oscillator, and the state controller is configured to change an operation state of the connector from an inactive state to an active state.

20. The memory storage device according to claim 19, wherein the predetermined signal is a wake-up signal or a reset signal.

21. The memory storage device according to claim 20, wherein the wake-up signal comprises the burst signal and a gap signal, the reset signal comprises the burst signal and a gap signal, and a length of the gap signal of the reset signal is greater than a length of the gap signal of the wake-up signal.

22. The memory storage device according to claim 21, wherein the burst signal, the wake-up signal, and the reset signal conform to an out-of-band (OOB) signaling specification.

23. The memory storage device according to claim 17, wherein the operation of the power management circuit for turning off the first oscillator comprises:
- the power management circuit receives a command from the memory controller; and
- the power management circuit turns off the first oscillator according to the command after the memory controller enters a power down mode.

24. The memory storage device according to claim 17, wherein the connector further comprises:
- a signal detector, coupled to the checking circuit, configured to receive the signal stream, and determine whether a power level of the signal stream is greater than a predetermined power,
- if the power level of the signal stream is greater than the predetermined power, the signal detector is configured to transmit the signal stream to the checking circuit.

* * * * *